United States Patent [19]
Ikeda

[11] Patent Number: 6,022,672
[45] Date of Patent: *Feb. 8, 2000

[54] METHOD OF MANUFACTURING SEMICONDUCTORS HAVING IMPROVED TEMPERATURE CONTROL

[75] Inventor: Rikio Ikeda, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/621,332

[22] Filed: Mar. 25, 1996

Related U.S. Application Data

[63] Continuation of application No. 08/341,941, Nov. 16, 1994, abandoned.

[30] Foreign Application Priority Data

Nov. 19, 1993 [JP] Japan ................................ P05-290494
Nov. 19, 1993 [JP] Japan ................................ P05-290495

[51] Int. Cl.[7] ..................................................... G03C 5/00
[52] U.S. Cl. .......................... 430/325; 430/327; 430/330
[58] Field of Search ................................ 430/270.1, 325, 430/330, 30, 327

[56] References Cited

U.S. PATENT DOCUMENTS

| | | | |
|---|---|---|---|
| 4,717,645 | 1/1988 | Kato et al. ............................... | 430/325 |
| 4,924,800 | 5/1990 | Tanaka ..................................... | 118/634 |
| 4,985,722 | 1/1991 | Ushijima et al. ........................ | 354/319 |
| 5,339,128 | 8/1994 | Tateyama et al. ....................... | 354/317 |
| 5,401,316 | 3/1995 | Shiraishi et al. ........................ | 118/689 |

FOREIGN PATENT DOCUMENTS

| | | |
|---|---|---|
| 60-157225 | 8/1985 | Japan . |
| 61-156814 | 7/1986 | Japan . |
| 62-18028 | 1/1987 | Japan . |
| 64-59915 | 3/1989 | Japan . |

*Primary Examiner*—Maria Nuzzolillo
*Assistant Examiner*—Laur Weiner
*Attorney, Agent, or Firm*—Hill & Simpson

[57] ABSTRACT

A method, system or device for forming a resist pattern applied to fine processing, such as that for preparation of a semiconductor device. The wafer transportation system for the process affected by processing conditions of the process, such as the temperature or time, is provided independently of the wafer transportation system for other processes in order to prevent heat transmission through a transport arm to assure a more accurate resist forming operation and to control the wafer transportation time between the processes more accurately and promptly. Pattern formation may be achieved more accurately through the use of a chemical amplification resist material subject to influences from the wafer environment.

12 Claims, 5 Drawing Sheets

METHOD OF MANUFACTURING SEMICONDUCTORS HAVING IMPROVED TEMPERATURE CONTROL

This is a continuation of application Ser. No. 08/341,941, filed Nov. 16, 1994, now abandoned.

BACKGROUND OF THE INVENTION

1. Field of the Invention

This invention relates to a method for forming a resist pattern applied to fine processing, such as preparation of a semiconductor device, and a system or device resulting therefrom. More particularly, it relates to a method and an apparatus for improving resist pattern linewidth stability by accurate time control from the end of light exposure until heat treatment or cooling and by temperature and process time control of the resist coating/development device.

2. Description of the Related Art

In the field of preparation of semiconductor devices, the design rule refinement is proceeding at an amazing speed. The technique of fine processing capable of achieving the minimum processing size on the order of 0.35 μm and on the order of 0.25 μm is required for the 64 MDRAM of the next generation and for the 256 MDRAM of the next-to-next generation. The key technology for such fine processing is photolithography. Research into the far ultraviolet lithograph employing a far UV light source such as a KrF eximer laser light beam ($\lambda$=248 nm) are now proceeding briskly as one of the alternatives of the photolithographic techniques.

In the above-described ultra-fine processing, the accuracy demanded of the resist pattern is generally ±10% of the design rule. Thus, for the design rule of 0.35 μm, for example, the accuracy demanded is ±0.035 μm.

Such accuracy is deteriorated by various factors related to various photolithographic operations, such as light exposure, resist coating or development. What is desired in connection with the resist coating/development device (coater/developer) is the uniform resist film thickness, uniform resist development speed and a wafer environment control for attaining such uniform resist film thickness and uniform resist development speed. These desired objective have recently been felt most strongly as the chemical amplification resist material has attracted attention as a resist material for eximer laser lithography. The reason is that, since the acid catalyst taking part in a resist reaction of the chemical amplification resist material is of an extremely small quantity, pattern accuracy is affected significantly by the slightest fluctuations in the wafer atmosphere. Consequently, various measures have been taken in the resist coating/developing device for controlling the wafer environment.

FIG. 1 shows an arrangement of a customary resist coating/development system. This system includes a series of integrated units comprised of a carrier station (C/S) 1 for transporting wafers into and out of a cassette containing a large number of wafers, plural processing units for executing contiguous process steps and a transportation system (H) 16 for transporting wafers into and out of the processing units and a light exposure device.

FIG. 1 shows a left block and a right block, separated from each other by broken lines, and taken charge of by the same transporting system. With the integrated transporting system, shown in FIG. 1, wafer transportation between specified processing units in a given processing block influenced by the temperature and the time and those in the processing block not influenced by the temperature and the time may be carried out by the same transporting system. Among the processing units, there are a hydrophobic processing unit (HMDS) 7 for carrying out hexamethyl disilazane treatment for improving tightness of bonding between the wafer and the layer of the resist material, a resist coating unit (Coat) 9, heating units (HP) 7, a development unit (Dev) 4 and cooling/temperature conditioning units (C) 3, 8.

The transporting device (H) 16 includes a transport arm (A) 17 for handling the wafer. The transport arm (A) 17 is thermally isolated from the heating units (HP) 2, 7 and maintained at a temperature approximately equal to the temperature within the clean room, such that thermal stability on the order of ±0.2° C. is achieved. The wafer processing system may be split into two blocks with an interfacing unit IF in-between, in which case the heating, cooling/temperature control (C) is carried out by one and the same transport system.

The heating units (HP) 2, 7 are provided with enclosed hot-plates, heated in general to 80 to 120° C., and are employed for pre-baking for volatilizing the solvent in the resist coating film for stabilizing resist sensitivity and the residual film rate, post-exposure baking (PEB) for progression of a resist reaction after light exposure, or post-baking for improving thermal resistance or resistance against dry etching of the formed resist pattern.

The cooling/temperature control units (C) 3, 8 are provided with metal cooling plates maintained at 20 to 25° C. by circulation of cooling water, and are employed for temperature controlling the wafer before resist coating or development of wafer cooling after the end of the heating and hydrophobic processing treatment.

With the above-described system, the process parameters of each unit need be controlled strictly. For example, with a semiconductor device fabricated with the design rule of 0.35 μm, the resist film thickness and linewidth are required to be uniform on the order of ±2.3 μm and ±0.035 μm, respectively. Thus the wafer temperature and the process time in the resist coating unit and in the development unit are controlled to be within the ranges of accuracy of ±0.1° C. and less than 0.1 second, respectively. On the other hand, since the heating operations, such as pre-baking or PEB, are parameters influencing the resist sensitivity, the processing in the heating units taking charge of these heating operations are also controlled stringently. With the conventional resist coating/development device, as described above, the process parameters in each unit are controlled stringently. It has however been found that temperature control of the wafers transported into the resist coating unit or the development unit and total control of the heating time cannot as yet been achieved satisfactorily.

For example, the transport arm (A) 17 of the same transporting device (H) 16 shown in FIG. 1 is gradually raised in its temperature as it repeatedly transports pre-baked wafers or post-exposure-baked wafers out of the heating units (HP) 2, 7 under the action of heat accumulation. Consequently, if the temperature-controlled wafer is transported out of the cooling/temperature control unit (C) 38 and into the resist coating unit or development unit, using the same transport arm (A) 17, the wafer temperature is increased by about 0.5 to 1.5 degree in less than one minute in which the wafer is held by the transport arm. The resist film thickness is known to be changed in thickness at a rate of 5 to 10 nm/° C. Such temperature rise causes resist film thickness fluctuations exceeding the range of fluctuations of ±2.3 nm allowed under the design rule of 0.35 μm.

On the other hand, the total heating time is changed in the following cases. For example, if, in the right-hand side block of FIG. 1, the same transport arm (A) 17 is engaged in the wafer transport for other processing operations, it may occur that the heated wafer cannot be taken out of the heating unit (HP) 7, or the wafer taken out cannot be immediately transported to the next cooling/temperature control unit (C) 8. This is equivalent to prolonging the effective heating time. Above all, if a chemical amplification type resist susceptible to a wafer atmosphere is employed, prolonged exposure of the wafer to outside atmosphere at an elevated temperature leads to deactivation of an acid catalyst and to significant deterioration in linewidth stability.

The above-described circumstances which lead to the worsening of the linewidth stability similarly exist for the case in which the system is split into left and right blocks with the interfacing unit 5 in-between and in which the wafers of the left and right blocks are transported by one and the transport system.

The chemical amplification type resist is a photoresist material in which the acids generated on decomposition of an photo-acid generator on exposure to light act as catalysts for resist reactions such as cross-liking or polymerization of the base resin or transformation of functional groups during the next post-exposure baking (PEB) process for producing changes in local solubility in the developing solution. It is however known that, since the acid acts as the catalyst exists in an extremely small quantity, the linewidth stability in case of employing the chemical amplifier type resist material is affected significantly by the least changes in the processing conditions.

These factors of fluctuations are present in a number of photolithographic operations, such as light exposure, resist coating, baking, and thus a variety of countermeasures have been proposed in connection with the light exposure device or the resist coating/developing deice (coater/developer).

Among the countermeasures concerning the resist coating/developing device, there is a process control known as TACT control. This control resides in a process in which the process time or TACT (scheduled wafer transportation) time in the resist coating, baking and development units is set to a pre-set value so that processing in each wafer is carried out by the same process flow. This method has led to resolution of wafer stagnation in the usual processing processes of the system or resulting fluctuations in the baking time, thereby achieving improvement in linewidth stability, although to a limited extent.

However, the parameter affecting pattern accuracy most significantly in the pattern formation employing the chemical amplifier resist is the time which elapses since the end of light exposure until start of PEB. If, with the use of a positive resist, for example, acids produced on light exposure are diffused within such time into the non-exposed area to decompose a solution inhibiting agent in an excess amount, the pattern linewidth tends to be finer or contract tends to be lowered. Conversely, should hexamethyl disilazane (HMDS) used for hydrophobic processing treatment, resist developing solution, paint used for the wall surface of a clean room or alkali vapor derived from a high efficiency particle air (HEPA) filter, be present at this time in the atmosphere, the acids tend to be deactivated, thus enlarging the line width.

However, the above-mentioned TACT control refers to time control between respective processes carried out in the resist coating/development device, such that it is not possible with TACT control to adjust the timing between one of the processes and the process carried out in the light exposure device. This induces the following problem.

With TACT control, process time fluctuations are produced with the TACT time as a unit. If, for example, the TACT time is set to 100 seconds, the wafer for which the light exposure has come to an end within 100 seconds is immediately transported to the PEB process. On the other hand, the wafer for which 101 seconds were consumed for light exposure needs to rest in a stand-by state for as long as 99 seconds until the next transport timing. That is, the process time difference of one second in the previous process is enlarged to a time difference of 100 seconds prior to the start of the next process.

The experiments conducted by the present inventor have revealed that, if a linewidth of 0.35 $\mu$m is formed using a chemical amplifier resist material manufactured by SIPLAY INC. under the trade name of XP8843, the linewidth was fluctuated by as much as 0.05 $\mu$m by changes in the time since light exposure until PEB of 100 seconds. Besides, the line pattern was fluctuated by as much as 0.10 $\mu$m in an amine atmosphere of 1 ppm. Our tentative calculations have revealed that the tolerance for linewidth uniformity for the 0.35 $\mu$m design rule is ±0.023 $\mu$m, which is clearly exceeded with the above linewidth fluctuations.

For overcoming such contradiction in TACT control, it may be envisaged to re-design the TACT time for each layer of the devices or to set the longest conceivable TACT time. However, these measures cannot be said to be practically acceptable in that the through-put is significantly lowered or the wafer downstream of the PEB process is maintained at an elevated temperature for long and thus in the excessively baked state without being transferred to the cooling/temperature control unit, thereby significantly deteriorating linewidth uniformity.

OBJECT AND SUMMARY OF THE INVENTION

It is an object of the present invention to provide a method and a system for improving linewidth uniformity of the resist pattern.

The above-described problem inherent in the conventional temperature control is derived from the fact that a common transportation system is employed for the transportation of the wafers into and out of the cooling/temperature control unit and the heating unit, and that the operation of the transportation system is placed under limitations imposed by other processing processes. This problem may be resolved if the wafer transportation by system portions liable to be affected by temperature and time of the other processes could be taken charge of by independent dedicated transportation systems. The common transportation system herein means one and the same wafer transportation system employed for the wafer processing process of the system portion liable to be influenced by temperature and time and for the wafer processing processes not liable to be influenced in this manner.

That is, referring to the right block of FIG. 1, the resist processing method of the present invention resides in that, when sequentially transporting the substrate between three or more processes including at least one heating process, at least one cooling/temperature control process and at least one other process, using a transportation system, and performing pre-set resist processing on the substrate, a dedicated transportation system independent of a transportation system employed for processes other than the heating process and the cooling/temperature control process is employed between the heating process and the cooling/temperature control process.

The heating process is typically at least one of a pre-baking process, and a post-baking process.

The processes other than the heating process and the cooling/temperature control process may be enumerated by the resist coating process and the development process, and a dedicated transportation system may be employed between any of these processes and the cooling/temperature control process.

The process time in the processes taken charge of by the dedicated transportation system is preferably maintained at a constant value based on the operation of the dedicated transportation system.

The above-described method is effective when the layer of the resist material is a layer of a conventional resist material for g or i rays. However, it is most effective when the layer of the resist material is a layer of a chemical amplification type resist material sensitive to the wafer environment.

The above-mentioned resist processing method may actually be carried out using the following resist processing device. That is, the resist processing device includes at least one heating unit for heating a substrate, at least one cooling/temperature control unit for cooling/temperature controlling the substrate, at least one processing unit for carrying out another processing, and a main transportation system for transporting substrates into and out of the device. A dedicated transportation system independent of the main transportation system is provided between the heating unit and the cooling/temperature control unit.

The heating unit is a unit which performs at least one of the hydrophobic treatment, pre-baking, post-exposure baking and post-baking operations for the substrate.

Post exposure baking is a step of baking performed after an exposure process but before a developing process. Post backing is a step of baking performed after a developing process.

A practical example of the processing unit for carrying out another processing is a resist coating unit or a developing unit. A dedicated transportation system independent of the main transportation system may be provided between these units and the cooling/temperature controlling unit.

For utmost effects, operation control means is preferably provided for controlling the process time in each unit connected to the dedicated transportation system to be constant based on the operation of the dedicated transportation system.

With the resist processing method and device of the present invention, since wafer transportation to a process or unit having a significantly different processing temperature is carried out using a dedicated independent transportation system, it becomes possible to avoid a situation in which a transport arm elevated in temperature be contacted with the temperature controlled wafer to raise its temperature.

Specifically, in a process flow comprised of wafer hydrophobic processing in a hydrophobic processing unit, followed by wafer temperature control by the cooling/temperature control unit and resist coating by the resist coating unit, in this order, or a process flow comprised of post-exposure baking in the heating unit, followed by wafer temperature control in the cooling/temperature control unit and resist development in the developing unit, in this order, transportation between the units is carried out by an individual dedicated transportation system for realizing more well-defined thermal separation between the processes or units.

With the use of such dedicated transportation system, the processes interconnected thereby is not affected by other usual processing processes. Thus there is no such risk that the wafer processed by various baking processes in the heating unit be left in the heating unit, or that the wafer at an elevated temperature be exposed to outside atmosphere for long without being transported into the cooling/temperature control unit.

The result is that control of the process parameters individually undertaken in each unit becomes truly meaningful control to render it possible to effect accurate resist film thickness control, linewidth control and residual film thickness control. The resist pattern forming method of the present invention resides in controlling the time since the end of light exposure on the layer of the resist material on the substrate until start of heat treatment to be constant independently of the time for other processes.

Such control may also be combined with the control of maintaining the constant time since the end of heat treatment until the start of cooling.

The light exposure is not limited to exposure by the eximer laser and may also be exposure by an energy beam, for example, an electron beam or an ion beam.

The method of the present invention may be employed most effectively in pattern formation employing a chemical amplifier resist material which is influenced most sensitively by the time consumed by the process of light exposure followed by PEB followed in turn by cooling.

The resist pattern formation system of the present invention is employed for realizing the above-mentioned method, and includes a light exposure unit for exposing the layer of the resist material on the substrate to light, a heating unit for heating the substrate, a main transportation system for transporting the substrate at least into and out of the system, and a dedicated transportation system, independent of the main transportation system, for interconnecting the former two units.

The system may also include a cooling/temperature control unit which may be interconnected with the remaining two units by independent dedicated transportation systems.

In any case, the present system may include a hydrophobic processing unit, a resist coating unit, a developing unit or a carrier station housing a wafer cassette, in addition to the above-mentioned units.

As an alternative arrangement, it is possible for the light exposure unit itself to contain a heater for heating its own substrate following exposure to light and a cooler for cooling the substrate following heating. In these cases, substrate transportation from the light exposure unit exposing the resist layer on the substrate to the heater and the cooler is taken charge of by a dedicated transportation system enclosed in the light exposure unit.

In the above-described resist pattern forming system, operation control means may be provided for maintaining constant process time in each unit or in each portion interconnected by the above-mentioned dedicated transportation system based upon the operation of the dedicated transportation system.

With the resist pattern forming method and system of the present invention, transportation between the processes or units influencing the accuracy in pattern formation by the use of the chemical amplifier resist may be carried out within an accurately defined time period. That is, the time period since light exposure until start of PEB, which influences the pattern formation accuracy most significantly, and the time period since PEB until start of cooling, which influences the pattern formation accuracy, although to a lesser extent, may be controlled accurately. With the use of such dedicated transportation system, the processes interconnected thereby are not affected by other usual processing processes. Thus there is no such risk that the wafer already exposed to light be exposed to outside atmosphere for long without being transported into the heating unit, or that the wafer processed with PEB in the heating unit be left without being transported into the cooling/temperature control unit. Thus it becomes possible to prevent the linewidth from being decreased due to acid diffusion following light exposure, or to prevent the linewidth from being increased due to acid deactivation.

Above all, if the light exposure unit and the heating unit are combined with each other in the light exposure unit, or further the light exposure unit and the cooling/temperature control unit are combined with each other in the light exposure unit, the wafer already exposed to light may be transferred to the PEB process and to the next following cooling/temperature control unit, without being exposed to outside atmosphere following light exposure, thus assuring highly accurate linewidth control.

According to the present invention, the time since the end of light exposure until the start of PEB, and the time since the end of PEB up to the start of cooling, which affect the resist reaction significantly, may be controlled to be shorter accurately, thereby significantly improving linewidth uniformity of the resist pattern. Utmost effects may be achieved with the use of a chemical amplifier resist material most sensitive to the above-defined time fluctuations. The present invention contributes to improvement in the integration degree and performance of the semiconductor device through formation of a more reliable pattern.

DETAILED DESCRIPTION OF THE PREFERRED EMBODIMENTS

Figure 1:
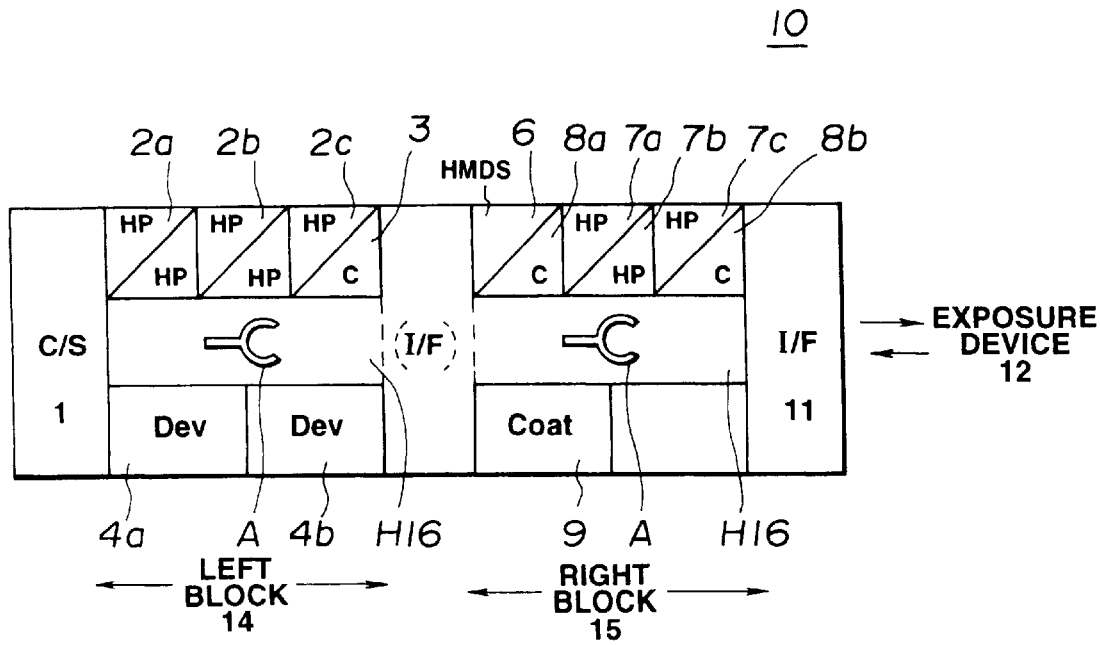
FIG. 1 is a schematic plan view showing an illustrative arrangement of a conventional typical resist coating/developing device.

Referring to the drawings, preferred embodiments of the present invention will be explained in detail.

Figure 2:
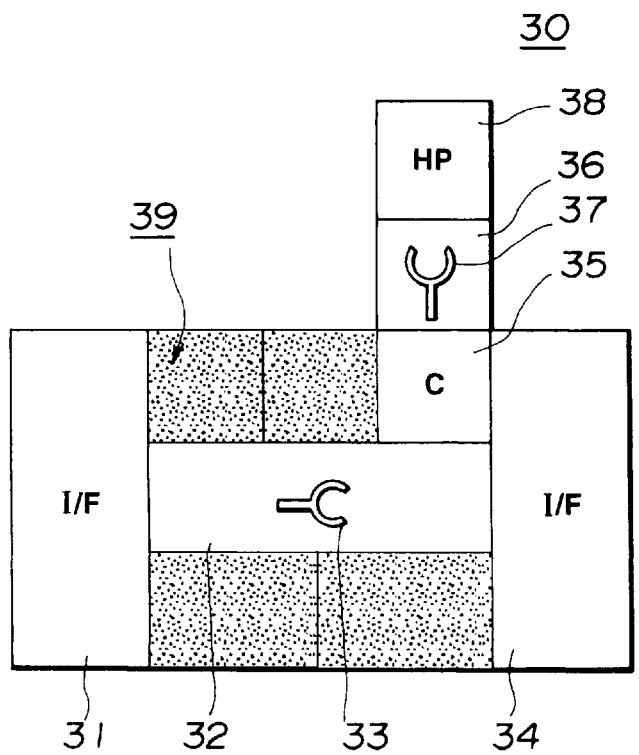
FIG. 2 is a schematic plan view showing an illustrative arrangement of a resist processing device having a dedicated transportation system between a cooling/temperature control unit and a heating unit according to a first embodiment of the present invention.

Referring first to FIG. 2, a resist processing device having a heating unit HP for post exposure heating (PEB) and a cooling/temperature control unit (C) for cooling or temperature controlling the wafers, interconnected via a dedicated transportation system, and the resist processing method employing the resist processing device, will be explained.

The resist processing device includes a plurality of processing units arranged on both longitudinal sides of a main transportation system 32, and interfaces (I/F) 31, 34 on transverse side ends for transporting wafers into or out of other process units or a light exposure device.

One of such processing units is a cooling/temperature control unit (C) 35 enclosing a cooling plate, not shown. The cooling plate also play the role of a wafer stage taking charge of wafer reception and delivery.

Since other units 39 may be suitably selected depending upon the type of desired processes, they are shown shaded without being shown in detail.

The main transportation system 32 has a transport arm 33 capable of position inversion by 360 and reciprocation in the fore-and-aft direction. The main transportation system transports wafers into an out of a number of units inclusive of the cooling/temperature control unit (C) 35.

The main point of the device is that the cooling/temperature control unit (C) 35 and the heating unit (HP) 38 taking charge of PEB are interconnected by an independent dedicated transportation system 36. The dedicated transportation system 36 has a transport arm 37 capable of position inversion through 180 and reciprocation in the fore-and-aft direction. Although the heating unit (HP) 38 is separated from a processing line comprised of other processing units, and is placed in a processing line branched at the cooling/temperature control unit (C) 35, this is merely illustrative and is not intended for limiting the plan configuration of the device. For example, the heating unit (HP) 38 may be arranged in the same processing line as the other processing units and a separate dedicated transportation system distinct from the main transportation system 32 may be provided between the heating unit (HP) 38 and the cooling/temperature control unit (C) 35. Alternatively, the cooling/temperature control unit (C) 35 and the heating unit (HP) 38 may be stacked up vertically and a dedicated transportation system may be provided between the two units.

The above-described device operates in the following manner.

A wafer exposed to light is transported via the interface 34 by the transport arm 33 of the main transportation system 32 and set on the cooling plate of the cooling/temperature control unit (C) 35. At this stage, accurate temperature control is not required because the next operation is PEB. Thus the wafer is immediately transported into the heating unit 38 by the transport arm 37 of the dedicated transportation system 36.

After the PEB continuing for a pre-set time in the heating unit (HP) 38 has come to an end, the wafer is again transported by the dedicated transportation system 36 to the cooling/temperature control unit (C) 35 for cooling. This transportation is carried out independently of the state of occupation of the transport arm 33 of the main transportation system 32. When the wafer has been temperature controlled to a temperature close to the room temperature of the clean room, the wafer is transported to the developing unit by the main transportation system 32. If the developing unit is any of the other units 39 shown shaded in FIG. 2, the wafer is transported thereto. Conversely, if the developing unit is outside the above device, the wafer is transported to outside via the interface (I/F) 31.

With the above-described arrangement and operation, since the main transportation system 32 handles only the temperature-controlled wafer, there is no risk of the wafer being raised in its temperature before being transported into the developing unit. On the other hand, even if the main transportation system 32 is employed for transporting another wafer, the wafer processed with PEB at the heating unit (HP) 38 is promptly taken out by the dedicated transportation system 36, after lapse of a pre-set time, and immediately transported into the cooling/temperature control unit (C) 35, so that the heating time in the heating unit (HP) 38 is observed accurately, while there is no risk of the wafer being allowed to stand at an elevated temperature in outside atmosphere.

Using such device, the layer of the novolak positive photoresist material for eximer laser lithography, manufactured by FUJI HUNT CO. LTD. under the trade name of FH-EX1, were post-exposure baked and developed. It was seen that linewidth uniformity of ±0.015 $\mu$m could be achieved with the line pattern of 0.35 $\mu$m in width.

Figure 3:
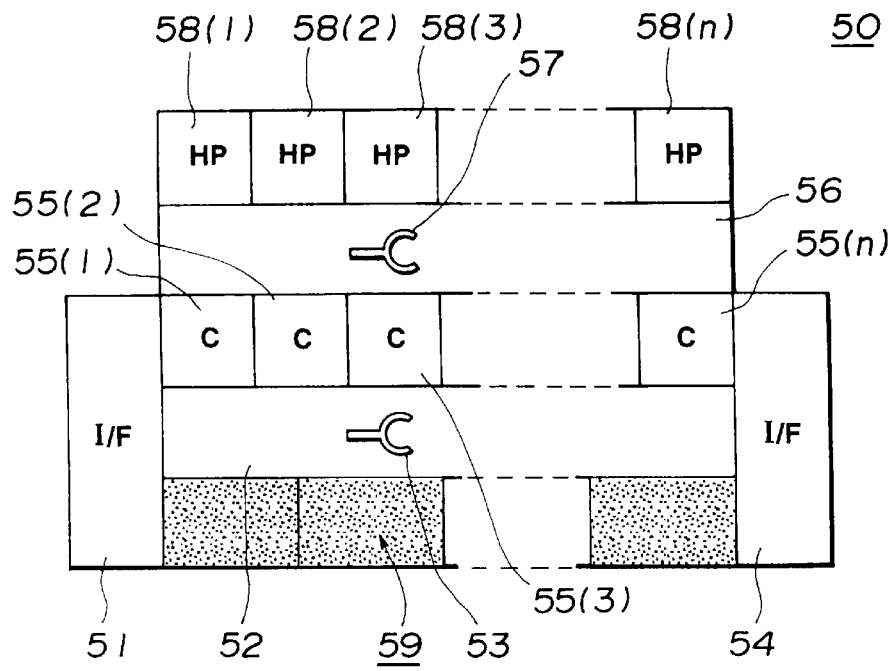
FIG. 3 is a schematic plan view showing an illustrative arrangement of a resist processing device having a common dedicated transportation system between a plurality of cooling/temperature control units and a heating unit according to a second embodiment of the present invention.

The device for parallel processing by employing a common transportation system between plural heating units (HP) 38 taking charge of PEB and the same plural number of cooling/temperature control units (C) 35 using the common dedicated transportation system, and the method for using the device, according to the second embodiment of the present invention, will be explained by referring to FIG. 3.

The device includes, as main constituents, a main transportation system 52, having a transport arm 53, a plurality of processing units 59 arranged on one longitudinal side of the main transportation system 52 for performing processing operations unrelated to heating/cooling on the layer of the resist material on the wafer, a plurality of cooling/temperature controlling units (C) 55(1), 55(2), . . . 55(n), arranged on the opposite longitudinal side of the main transportation system 52, a dedicated transportation system 56 arranged on the back side thereof parallel to the main transportation system 52, heating units (HP) 58(1), 58(2) . . . 58(n) arranged parallel to the cooling/temperature controlling units (C) 55(1), 55(2), . . . 55(n), with the dedicated transportation system 56 in-between, and interfaces (I/F) 51, 54 arranged on one transverse side of the main transportation system 52 for transporting the wafers into and out of another process unit or the exposure device. The heating units (HP) 58(1), 58(2) . . . 58(n) may also be stacked in tiers relative to the cooling/temperature controlling units (C) 55(1), 55(2), . . . 55(n) with a dedicated transportation system in-between.

The operation of the above-described device during use time is as follows:

The wafers already exposed to light are transported one by one by the transport arm 53 of the main transportation system 52 via the interface (I/F) 54 and set on the cleaning plates of the cooling/temperature controlling units (C) 55(1), 55(2), . . . 55(n) in this order. The wafers are then transferred on the associated heating units (HP) 58(1), 58(2) . . . 58(n) by the transport arm 57 of the dedicated transportation system 56 so that the wafer set on the cooling plate first is transported first in this manner.

After the PEB for a pre-set time within the heating units (HP) 58(1), 58(2) . . . 58(n) has come to a close, the wafers are transported by the dedicated transportation system 56 to the cooling/temperature controlling units (C) 55(1), 55(2), . . . 55(n) for cooling so that the wafers processed with PEB first is transported first in this manner. When the wafers have been temperature controlled to substantially the same temperature as the clean room temperature, they are sequentially transported to the developing unit by the main transportation system 52.

If the above-described arrangement and the method are employed, it becomes possible to control the wafer temperature more satisfactorily, as well as to improve the throughput by parallel processing significantly.

Using the above device, the layer of the novolak photoresist material for eximer laser lithography, prepared by FUJI HUNT CO. LTD. under the trade name of FH-EX1 was post-exposure baked and developed. It was seen that linewidth uniformity of ±0.015 $\mu$m could be achieved for the linewidth of 0.35 $\mu$m.

Figure 4:
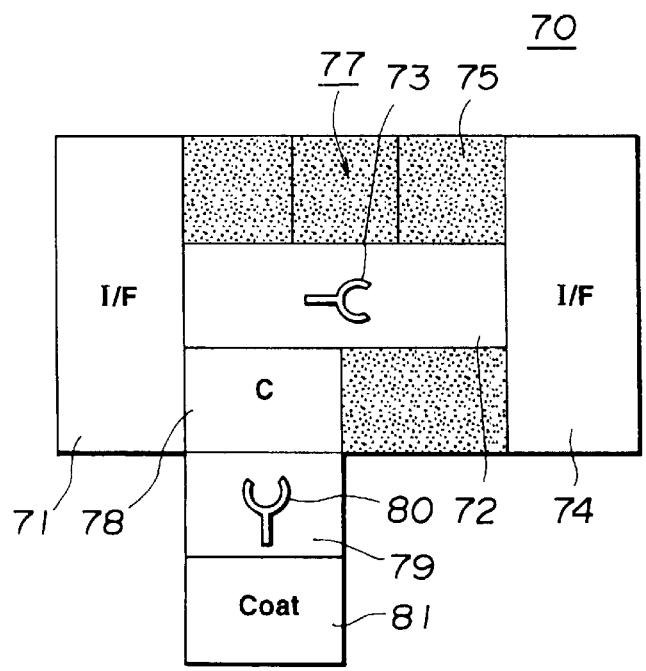
FIG. 4 is a schematic plan view showing an illustrative arrangement of a resist processing device having a dedicated transportation system between a cooling/temperature control unit and a resist coating unit according to a third embodiment of the present invention.

The resist processing device comprised of a resist coating unit (Coat) and the cooling/temperature control unit (C) 35 interconnected by a dedicated transportation system, and the method of using the device, according to a third embodiment of the present invention, will be explained by referring to FIG. 4.

In this device, one of plural processing units arrayed around the main transportation system 2 is a cooling/temperature control unit (C) 78.

The main point of construction of the above device resides in that the cooling/temperature control unit (C) 78 is connected to a resist coating unit (Coat) 81 by a dedicated transportation system 79 which is isolated from the main transportation system 72 which has enclosed therein a transport arm 80 maintained at the same temperature as the clean room temperature.

The operation of the above-described device during use time is as follows:

The wafer from hexamethyl disilazane (HMDS) processing and cooling processes is transported out of the hydrophobic processing unit by a transport arm 73 of the main transportation system 73. The hydrophobic processing unit may be any one of the other units or a unit outside of the interfacing units (I/F) 71, 74. This wafer is then set by the transport arm 73 on the cooling plate of the cooling/temperature control unit (C) 78 for temperature control. The wafer thus temperature controlled is transported by the dedicated transportation system 79 to the resist coating unit (Coat) 81. The wafer from the resist coating process is again transported by the dedicated transportation system 79 into the cooling/temperature control unit (C) 78 and thence transported by the main transportation system 79 into the heating unit (HP) for pre-baking. This heating unit may be one of the units 77 or a unit outside of the interfaces (I/F) 71, 74.

During such transportation, the transport arm 80 of the dedicated transportation system 79 transporting the temperature-controlled wafer from the cooling/temperature control unit (C) 78 to resist coating unit (Coat) 81 is perpetually maintained at the same temperature as the clean room temperature. Thus the wafer temperature at the time of resist coating is perpetually constant to render it possible to precisely control the resist film thickness.

Using the above device, a pattern of a layer of a chemical amplifier photoresist material, manufactured by SIPLAY INC. under the trade name of XP8843, was prepared. It was found that the requirement of the film thickness uniformity of ±2.0 mm under the 0.25 μm rule has now be met.

Figure 5:
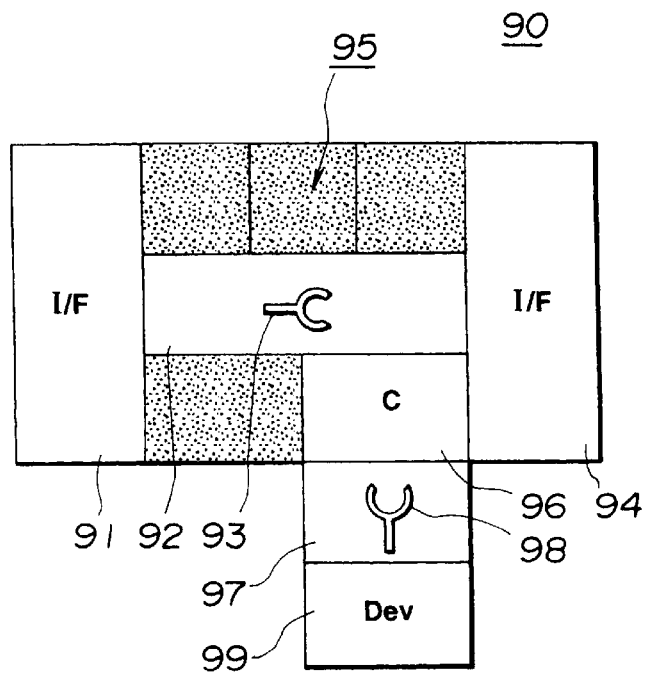
FIG. 5 is a schematic plan view showing an illustrative arrangement of a resist processing device having a dedicated transportation system between a cooling/temperature control unit and a developing unit according to a fourth embodiment of the present invention.

The resist processing device comprised of a resist developing unit (Dev) and the cooling/temperature control unit (C) interconnected by a dedicated transportation system, and the method of using the device, according to a fourth embodiment of the present invention, will be explained by referring to FIG. 5.

In this device, one of plural processing units arrayed around the main transportation system 92 is a cooling/temperature control unit (C) 96.

The main point of construction of the above device resides in that the cooling/temperature control unit (C) 96 is connected to a developing unit (Dev) 99 by a dedicated transportation system 97 which is distinct from the main transportation system 92 and which has enclosed therein a transport arm 98 maintained at the same temperature as the clean room temperature.

The operation of the above-described device during use time is as follows:

The wafer from PEB and cooling processes is transported out of the heating unit by a transport arm 93 of the main transportation system 92. The hydrophobic processing unit may be any one of the other units 95 or a unit outside of the interfacing units (I/F) 91, 94. This wafer is then set by the transport arm 93 on the cooling plate of the cooling/temperature control unit (C) 96 for temperature control. The wafer thus temperature controlled is transported by the dedicated transportation system 97 to the developing unit (Dev) 99. The wafer from the developing process is again transported by the dedicated transportation system 97 into the cooling/temperature control unit (C) 96 and thence transported by the main transportation system 97 into the heating unit (HP) for pre-baking. This heating unit may be one of the units 95 or a unit outside of the interfaces (I/F) 71, 74.

During such transportation, the transport arm 98 of the dedicated transportation system 97 transporting the temperature-controlled wafer from the cooling/temperature control unit (C) 96 to the developing unit (Dev) 99 is perpetually maintained at the same temperature as the clean room temperature. Thus the wafer temperature at the time of development is perpetually constant to render it possible to precisely control the resist development rate.

Using the above device, a pattern of a layer of a chemical amplifier photoresist material, manufactured by SIPLAY INC. under the trade name of XP8843, was prepared. It was found that film thickness uniformity of ±2.0 mm, as required under the 0.25 μm rule, has now be achieved.

The resist processing device comprised of a hydrophobic processing unit (HMDS) and the cooling/temperature control unit (C) interconnected by a dedicated transportation system, and the method of using the device, according to a fifth embodiment of the present invention, will be explained by referring to FIG. 6.

In this device, one of plural processing units arrayed around the main transportation system 112 is a cooling/temperature control unit (C) 115.

The main point of construction of the above device resides in that the cooling/temperature control unit (C) 115 is connected to a hydrophobic processing unit (HMDS) 118 by a dedicated transportation system 116 which is independent of the main transportation system 112 and which has enclosed therein a transport arm 117 maintained at the same temperature as the clean room temperature. The hydrophobic processing unit (HMDS) also encloses a supply system for a hexamethyl silazane vapor and a hot plate, not shown.

The operation of the above-described device during use time is as follows:

The wafer is transported from a carrier station by the transport arm 113 of the main transportation system 112 via an interface (I/F) 111. The wafer is then set by the transport arm 113 on the cooling plate of the cooling/temperature control unit (C) 118. Temperature control is not required at this stage. The wafer is then transported by a dedicated transportation system 116 into a hydrophobic processing unit (HMDS) 118. The wafer from the hydrophobic processing process is transported by the dedicated transportation system 116 into the cooling/temperature control unit (C) 115 for temperature control. The temperature-controlled wafer is transported by a transportation system 112 into a resist coating unit. The resist coating unit may be any one of the other units 116, or a unit outside of the interfaces (I/F) 111, 114.

With the above-described device and operation, since the main transportation system 112 handles only the temperature-controlled wafer, there is no risk of the wafer prior to being transported into the resist coating unit being raised in temperature. Thus the wafer temperature at the time of resist coating is perpetually constant to render it possible to precisely control the resist development rate.

Using the above device, a pattern of a layer of a chemical amplifier photoresist material, manufactured by SIPLAY INC. under the trade name of XP8843, was prepared. It was found that film thickness uniformity of ±2.0 mm, as required under the 0.25 μm rule, has now be achieved.

The present invention is not limited to the above-described five embodiments. For example, in the above embodiments, dedicated transportation systems are provided for two particular units. However, these embodiments may be combined in any desired manner. Thus a resist processing unit etc., having a dedicated transportation system, may be provided between the cooling/temperature control unit (C) and resist coating unit (Coat) and between the heating unit (HP) and the cooling/temperature control unit (C).

It is seen from above that, according to the present invention, temperature control and process time control may be achieved more precisely in each of the steps related to resist processing than conventionally. Thus the film thickness, linewidth or the residual film thickness of the resist pattern may be controlled more accurately and with higher reproducibility so that pattern formation may be improved in reliability even in case of employing a chemical amplifier photoresist material susceptible to influences from states of the wafer environment. The present invention thus contributes significantly to a higher integration degree and higher performance of the semiconductor devices.

Figure 7:
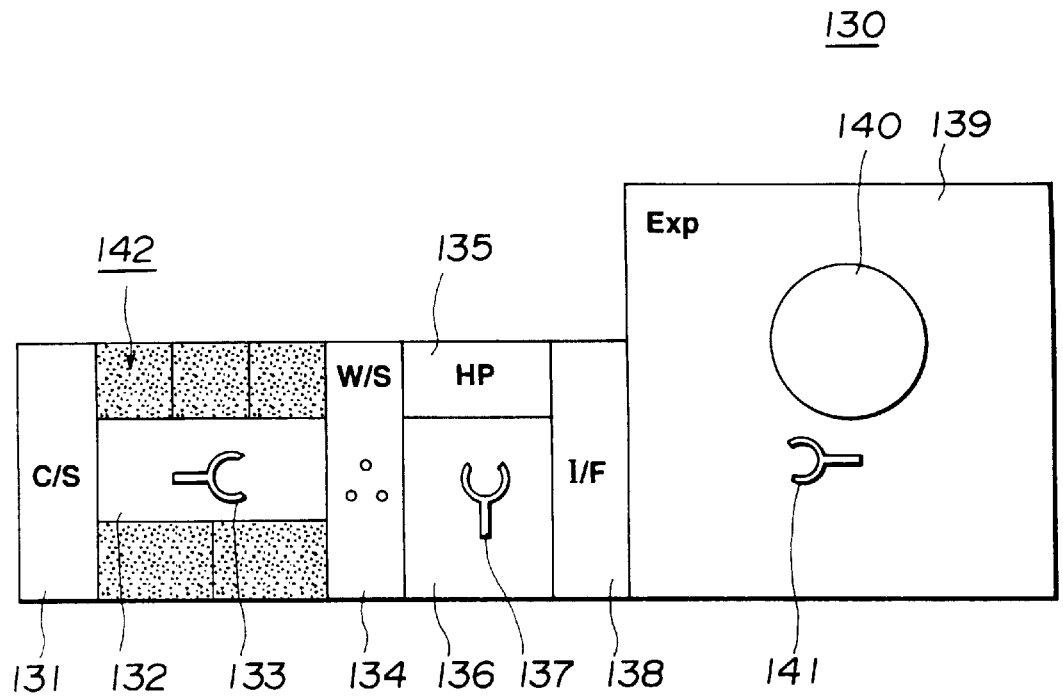
FIG. 7 is a schematic plan view showing a resist pattern formation system having a dedicated transportation system between a light exposure unit and a heating unit integrated to each other via an interfacing unit according to a sixth embodiment of the present invention.

The resist processing device having a dedicated transportation system between an exposure unit (Exp) and a heating unit (HP) integrated to each other by an interface (I/F), and the method of using the device, according to a sixth embodiment of the present invention, will be explained by referring to FIG. 7.

With this system, the conventional resist coating/development device and the light exposure device are interconnected by an interface 138 in order to assure transport control in and between the devices.

The portions of the system corresponding to the conventional resist coating/development device include, as main components, a carrier station (C/S) 131, holding a plurality of wafers, a main transportation system 132 for taking out the wafers one by one for transporting the wafers to various processing units 142, a wafer stage (W/S) 134 for temporarily setting the wafers set on a transport arm 133 of a main transportation system 132, a dedicated transportation system 136 having a transport arm 137 for transporting the wafers into and out of a light exposure unit 139 via an interface 138 and a heating unit (HP) 135 having an enclosed hot plate for PEB.

The processing unit 142 includes in general a hydrophobic processing unit, a resist coating unit, a heating unit for pre-baking or post-baking, a development unit and a cooling/temperature control unit, etc. Since the number and the type of the units may be optionally selected depending upon the desired process, these units are shown shaded without being identified specifically.

The constitution of the light exposure unit (Exp) 139 is similar to the conventional light exposure device and includes a light exposure stage 140 and a transport arm 141 for setting the wafer thereon, etc.

The main point of the above-depicted arrangement resides in that a heating unit (H) 195 for PEB is arranged at a location closest to the light exposure unit (Exp) 139 independently of the heating unit performing heating for other purposes, and in that a transportation system for transporting the wafer from the light exposure unit 139 to the heating unit (H) 135 (dedicated transportation system 136) is isolated from the main transportation system 132.

The operation of the above-described device during use time is as follows:

The wafer from the resist coating, pre-baking and cooling, performed by any of the processing units 142, is set on the wafer stage 134 by the transport arm 133 of the main transportation system 132. The wafer is transported by the transport arm 137 of the dedicated transportation system 136 into the light exposure unit (Exp) 139 via the interface (I/F) 138 so as to be set by the transport arm 141 on the light exposure stage 140 for light exposure.

With the above-described system configuration and the method of operation for use, the time since the end of light exposure until the start of PEB depends only on the operation of the dedicated transportation system 136. Thus the time which elapses since the end of light exposure until the start of PEB depends only on the operation of the dedicated transportation system 136. Thus the above-defined time is not affected by whether or not the TACT control is performed between the processing units 142 related with the main transportation system 132 or where speed regulating process is performed. Even supposing that the wafer remains at a standstill in the wafer processing unit 142 or on the transport arm 133, the wafer already exposed to light may be processed promptly within a pre-set time up to PEB so as to be then left in a stand-by state on the transport arm 7 or on the wafer stage (W/S) 134.

With the above system, pattern formation was actually carried out by KrF eximer laser lithography using a chemical amplifier system resist material manufactured by SIPLAY INC. under the trade name of XP8843. It was found that linewidth uniformity of ±0.020 μm could be achieved with a line pattern having a linewidth of 0.35 μm.

Figure 8:
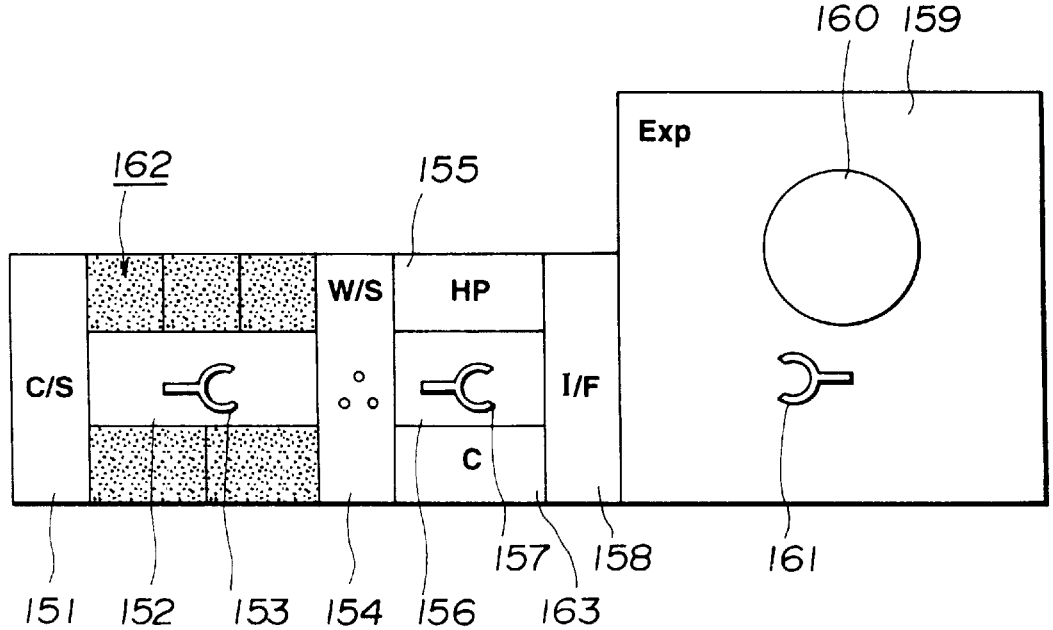
FIG. 8 is a schematic plan view showing a resist pattern formation system having a dedicated transportation system between a light exposure unit, a heating unit and a cooling/temperature control unit integrated to one another via an interfacing unit according to a seventh embodiment of the present invention.

The resist processing device having a dedicated transportation system between an exposure unit (Exp), a heating unit (HP) and a cooling/temperature control unit (C), integrated to each other by an interface (I/F), and the method of using the device, according to a seventh embodiment of the present invention, will be explained by referring to FIG. 8.

Figure 6:
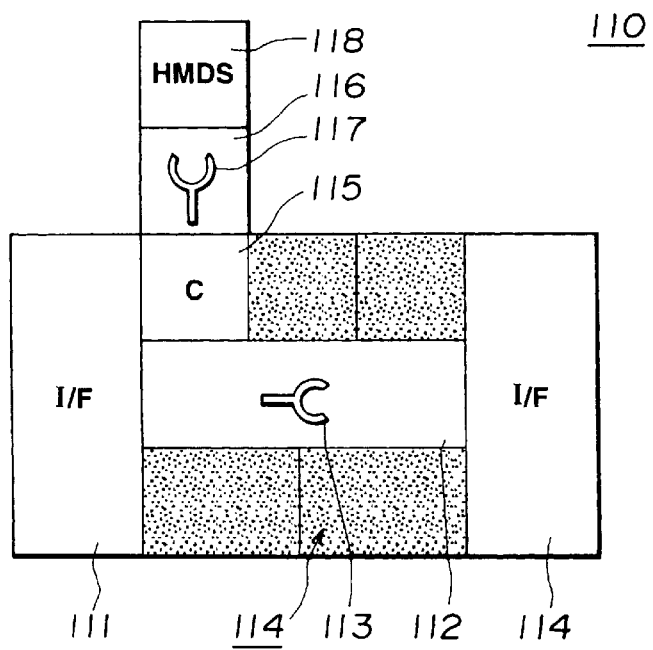
FIG. 6 is a schematic plan view showing an illustrative arrangement of a resist processing device having a dedicated transportation system between a cooling/temperature control unit and a hydrophobic processing unit according to a fifth embodiment of the present invention.

The present system differs from the system of FIG. 6 in that not only the heating unit (HP) 155 but also the cooling unit (C) 163 is taken charge of by the dedicated transportation system 156.

During use of the above system, the wafer exposed to light by the light exposure unit (Exp) 159 is transported via an interface (I/F) 158 to the heating unit (HP) 155 by the transport arm 157 of the dedicated transportation system 156 for FEB. The wafer from the FEB processing is immediately transported by the transport arm 157 to the cooling/temperature control unit (C) 163. The wafer is cooled therein to a temperature substantially equal to the clean room temperature (ambient temperature) and subsequently transported via the wafer stage (W/S) 154 to another processing unit 162 for development, post-baking etc.

With the above-depicted system configuration and the method of operation for use, the time since end of FEB until start of cooling is controllable irrespective of the main transportation system 152.

With the above system, pattern formation was actually carried out by KrF eximer laser lithography using a chemical amplifier system resist material manufactured by SIPLAY INC. under the trade name of XP8843. It was found that linewidth uniformity of ±0.015 μm, superior to a value achieved with the first embodiment, could be achieved with a line pattern having a linewidth of 0.35 μm.

Figure 9:
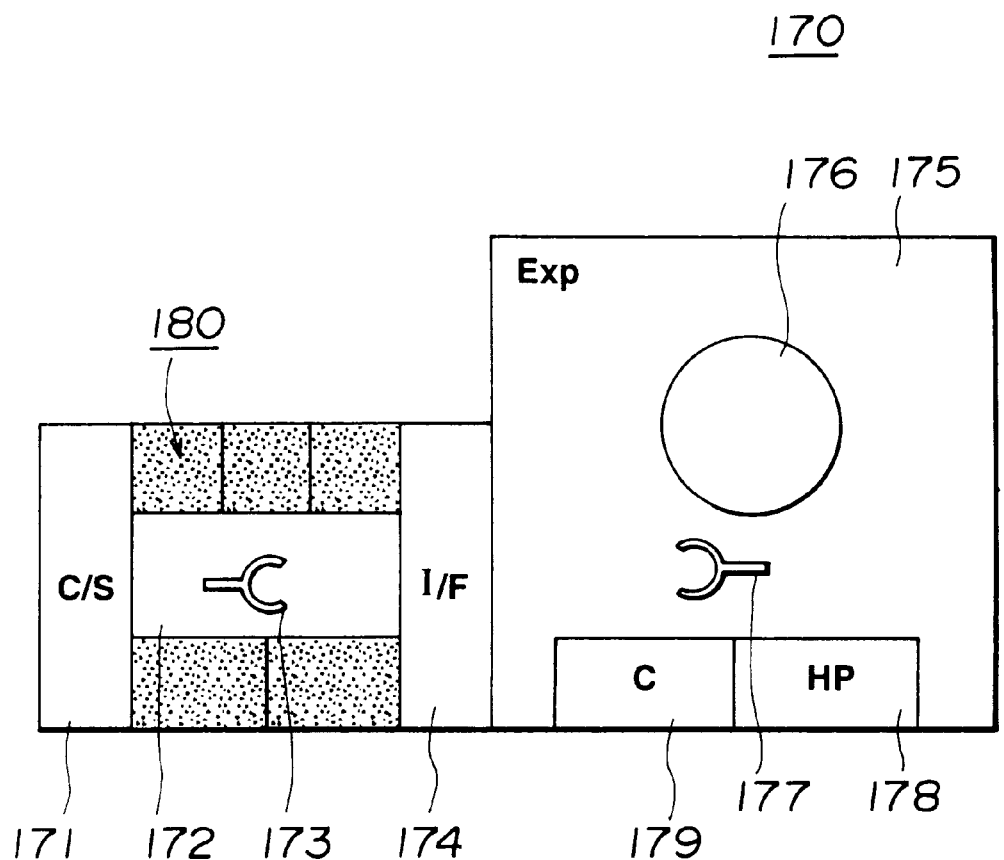
FIG. 9 is a schematic plan view showing a resist pattern formation system having a light exposure unit enclosing a heating unit and a cooling/temperature control unit according to a eighth embodiment of the present invention.

A resist pattern forming system enclosing the heating unit (HP) and the cooling unit (C) in a light exposure unit (exp) 175, according to an eighth embodiment of the present invention, is explained by referring to FIG. 9.

In its configuration, the present system integrates a portion of the cooling/temperature control unit and the heating unit contained in the conventional resist coating/development device into the inside of the light exposure device.

That is, the portions of the present system corresponding to the conventional coating/development device include a carrier station 171, a main transportation system 172 having a transport arm 173 and plural processing units 180 for performing various operations. These components are connected via an interface (I/F) 174 to the light exposure device (Exp) 175. The processing units 180 include in general a hydrophobic processing unit, a resist coating unit, a heating unit for pre-baking and post-baking, a development unit, a cooling/temperature control unit, etc.

The light exposure device (Exp) 175 includes, in addition to usual components of the light exposure device, such as a light exposure stage 176 or a transport arm 177, a heating unit (HP) 178 for PEB and a cooling/temperature control unit (C) 179 for cooling the wafer after PEB. The light exposure stage 176 and the heating unit 178 are sufficiently heat-insulated from each other.

In the drawings, only a sole transport arm 177 is shown. However, if the transportation in the light exposure unit (Exp) 175 in its entirety is to be handled by the sole transport arm, the heat of the wafer transported out of the heating unit (HP) 178 is stored in the transport arm 177. Thus there is a risk that he wafer set on the light exposure stage 176 tends to be raised in temperature. Thus it is practically preferred to separately provide the transport arm for the light exposure stage 176 and that for the heating unit (HP).

The main point of the above-depicted arrangement resides in that, by providing the heating unit (HP) 178 for PEB and the cooling/temperature control unit (C) 179 directly downstream thereof within the inside of the light exposure unit (Exp) 175, it becomes possible to effect a series of process steps since light exposure up to cooling through PEB promptly without exposing the wafer to atmospheric air.

The operation of the above-described device during use time is as follows:

The wafer directly from the resist coating and pre-baking processes is transported via the interface (I/F) 174 into the light exposure unit (Exp) 175 so as to be set on the light exposure unit 176 by the transport arm 177. The wafer exposed to light is immediately transported into the heating unit (HP) 178 for PEB. The wafer from the PEB process is immediately cooled within the cooling/temperature control unit (C) 179. The cooled wafer is transported via the interface (I/F) 174 so as to be transported by the transport arm 173 of the main transportation system 172 to the processing unit 180 for a preset processing.

With such system configuration and method, a minimum operating time suffices in order to perform transportation from light exposure up to cooling through PEB. Besides, the wafer is not contacted with outside atmosphere.

Using the above system, pattern formation was actually carried out by KrF eximer laser lithography with the aid of a chemical amplifier system resist material manufactured by SIPLAY INC. under the trade name of XP8843. It was found that linewidth uniformity of ±0.015 $\mu$m could be achieved with a line pattern having a linewidth of 0.35 $\mu$m.

What is claimed is:

1. A resist processing method comprising the steps of:
 applying a resist coating on a substrate;
 exposing the resist on the substrate to a light exposure device;
 transporting the substrate from the light exposure device to a cooling/temperature control unit which is capable of cooling/controlling the temperature of the substrate with a first transportation system;
 transporting the substrate from the cooling/temperature control unit to a heating unit with a second transportation system;
 heat processing in the heating unit;
 transporting the substrate from the heating unit to the cooling/temperature control unit after post exposure heating with the second transportation system;
 transporting the substrate from the cooling/temperature control unit to a further processing unit with a third transportation system, and
 developing the exposed resist on the substrate,
 wherein the second transportation system is separated from and independent of the first transportation system and the third transportation system.

2. The resist processing method of claim 1, wherein the second transportation system is separated from the first transportation system by at least one process station.

3. A resist processing method comprising the steps of:
 applying a resist coating on a substrate;
 exposing the resist on the substrate;
 transporting the substrate having the exposed resist from a first process unit to a cooling/temperature control unit which is capable of cooling/controlling the temperature of the substrate with a first transportation system;
 transporting the substrate having the exposed resist from the cooling/temperature control unit to a resist developing unit with a second transportation system;
 developing the resist on the substrate in the developing unit;
 transporting the substrate from the developing unit to the cooling/temperature control unit with the second transportation system; and
 transporting the substrate from the cooling/temperature control unit to a further process unit with a third transportation system, and
 wherein the second transportation system is independent of the first transportation system and the third transportation system.

4. The resist processing method of claim 3, wherein the second transportation system is separated from the first transportation system by at least one process station.

5. A resist processing method comprising the steps of:
 transporting a substrate from a first process unit to a cooling/temperature control unit which is capable of cooling/controlling the temperature of the substrate with a first transportation system;
 transporting the substrate from the cooling/temperature control unit to a hydrophobic processing unit with a second transportation system;
 treating the substrate with a hydrophobic process in the hydrophobic processing unit;
 transporting the substrate from the hydrophobic processing unit to the cooling/temperature control unit with the second transportation system;
 transporting the substrate from the cooling/temperature control unit to a further processing unit with a third transportation unit;
 applying a resist coating on the substrate in the further processing unit;
 exposing the resist on the substrate in the further processing unit; and
 developing the exposed resist on the substrate in the further processing unit, and
 wherein the second transportation system is separated from and independent of the first transportation system and the third transportation system.

6. The resist processing method of claim 5, wherein the second transportation system is separated from the first transportation system by at least one process station.

7. A resist processing method comprising the steps of:
 transporting the substrate from a first process unit to a cooling/temperature control unit which is capable of cooling/controlling the temperature of the substrate with a first transportation system;
 transporting the substrate from the cooling/temperature control unit to a resist coating unit with a second transportation system;
 applying a resist coating to the substrate in the resist coating unit;
 transporting the substrate from the resist coating unit to the cooling/temperature control unit with the second transportation system;
 transporting the substrate from the cooling/temperature control unit to a further processing unit with a third transportation system;

exposing the resist on the substrate; and developing the exposed resist on the substrate, and wherein second transportation system is separated from and independent of the first transportation system and the third transportation system.

8. The resist processing method of claim 7, wherein the second transportation system is separated from the first transportation system by at least one process station.

9. A resist processing method comprising the steps of:

applying a resist coating to a substrate in a resist coating unit;

transporting the substrate from the resist coating unit to a cooling/temperature control unit which is capable of cooling/controlling the temperature of the substrate with a first transportation system;

transporting the substrate from the cooling/temperature control unit to a heating unit with a second transportation system;

heat processing in the heating unit;

transporting the substrate from the heating unit to a cooling/temperature control unit after a pre-baking process with the second transportation system;

transporting the substrate from the cooling/temperature control unit to a further processing unit with a third transportation system;

exposing the resist on the substrate;

developing the exposed resist on the substrate; and wherein the second transportation system is separated from and independent of the first transportation system and the third transportation system.

10. The resist processing method of claim 8, wherein the second transportation system is separated from the first transportation system by at least one process station.

11. A resist processing method comprising the steps of:

applying a resist coating to a substrate;

exposing the resist on the substrate;

developing the resist on the substrate;

transporting the substrate having the developed resist to a cooling/temperature control unit which is capable of cooling/controlling the temperature of the substrate with a first transportation system;

transporting the substrate from the cooling/temperature control unit to a heating unit with a second transportation system;

heating as a post-baking process in the heating unit;

transporting the substrate from the heating unit to the cooling/temperature control after post-baking processing with the second transportation system;

transporting the substrate from the cooling/temperature control unit to a further processing unit with a third transportation system;

wherein the second transportation system is separated from and independent of the first transportation system and the third transportation system.

12. The resist processing method of claim 11, wherein the second transportation system is separated from the first transportation system by at least one process station.

* * * * *